(12) United States Patent
Taviani et al.

(10) Patent No.: US 9,329,250 B2
(45) Date of Patent: May 3, 2016

(54) **SYSTEM AND METHOD FOR COMBINED CHEMICAL SPECIES SEPARATION AND HIGH RESOLUTION $R_2^*$ MAPPING WITH MAGNETIC RESONANCE IMAGING**

(71) Applicant: Wisconsin Alumni Research Foundation, Madison, WI (US)

(72) Inventors: Valentina Taviani, Madison, WI (US); Diego Hernando, Madison, WI (US); Scott Brian Reeder, Madison, WI (US)

(73) Assignee: Wisconsin Alumni Resesarch Foundation, Madison, WI (US)

( * ) Notice: Subject to any disclaimer, the term of this patent is extended or adjusted under 35 U.S.C. 154(b) by 661 days.

(21) Appl. No.: 13/803,360

(22) Filed: Mar. 14, 2013

(65) Prior Publication Data

US 2014/0266192 A1 Sep. 18, 2014

(51) Int. Cl.
*G01R 33/48* (2006.01)
*G01R 33/50* (2006.01)
*G01R 33/561* (2006.01)

(52) U.S. Cl.
CPC ............ *G01R 33/4828* (2013.01); *G01R 33/50* (2013.01); *G01R 33/561* (2013.01)

(58) Field of Classification Search
CPC ... G01R 33/4828; G01R 33/50; G01R 33/561
See application file for complete search history.

(56) References Cited

U.S. PATENT DOCUMENTS 7,298,144 B2   11/2007   Reeder et al.
7,881,768 B2 *  2/2011   Lang .................. A61B 5/055
                                          600/407
8,781,197 B2 *  7/2014   Wang ..................... G01R 33/54
                                          382/131
2006/0250132 A1  11/2006  Reeder et al.

OTHER PUBLICATIONS

Bley, et al., Fat and Water Magnetic Resonance Imaging, Journal of Magnetic Resonance Imaging, 2010, 31:4-18.
Bydder, et al., Constraining the Initial Phase in Water-Fat Separation, Magnetic Resonance Imaging, 2011, 29 (2):216-221.
Cuppen, et al., Reducing MR Imaging Time by One-Sided Reconstruction, Magnetic Resonance Imaging, 1987, 5 (6):526-527.
Feinberg, et al., Halving MR Imaging Time by Conjugation: Demonstration at 3.5 kG, Radiology, 1986, 161 (2):527-531.
Haacke, et al., A Fast, Iterative, Partial-Fourier Technique Capable of Local Phase Recovery, Journal of Magnetic Resonance, 1991, 92(1):126-145.

(Continued)

*Primary Examiner* — Dixomara Vargas
(74) *Attorney, Agent, or Firm* — Quarles & Brady, LLP

(57) ABSTRACT

Described here is a system and method for estimating apparent transverse relaxation rate, $R_2^*$, while simultaneously performing chemical species separation (e.g., water-fat separation) using magnetic resonance imaging ("MRI"). A homodyne reconstruction of k-space datasets acquired using a partial k-space acquisition is used and the chemical species separation of the resultant images takes into account the spectral complexity of the chemical species in addition to magnetic resonance signal decay associated with transverse relaxation. Full resolution maps of $R_2^*$ are thus capable of being produced while also allowing for the production of images depicting the separated chemical species that are corrected for transverse relaxation associated signal decays.

13 Claims, 3 Drawing Sheets

(56) References Cited

OTHER PUBLICATIONS

Hernando, et al., Estimation of Water/Fat Images, B0 Field Map and T2* Map Using VARPRO, Proc. Intl. Soc. Mag. Reson. Med., 2008, 16:1517.

Hernando, et al., Robust Water/Fat Separation in the Presence of Large Field Inhomogeneities Using a Graph Cut Algorithm, Magnetic Resonance in Medicine, 2010, 63:79-90.

Hernando, et al., R*2 Mapping in the Presence of Macroscopic B0 Field Variations, Magnetic Resonance in Medicine, 2011, 11 pages.

Hernando, et al., Addressing Phase Errors in Fat-Water Imaging Using a Mixed Magnitude/Complex Fitting Method, Magnetic Resonance in Medicine, 2012, 67(3):638-644.

Liu, et al., Fat Quantification with IDEAL Gradient Echo Imaging: Correction of Bias From T1 and Noise, Magnetic Resonance in Medicine, 2007, 58:354-364.

Margosian, et al., Faster MR Imaging: Imaging with Half the Data, Health Care Instrumentation, 1986, 1(6):195-197.

McGibney, et al., Quantitative Evaluation of Several Partial Fourier Reconstruction Algorithms Used in MRI, Magnetic Resonance in Medicine, 1993, 30:51-59.

Noll, et al., Homodyne Detection in Magnetic Resonance Imaging, IEEE Transactions on Medical Imaging, 1991, 10 (2):154-163.

Reeder, et al., Homodyne Reconstruction and IDEAL Water-Fat Decomposition, Magnetic Resonance in Medicine, 2005, 54:586-593.

Reeder, et al., Quantification of Hepatic Steatosis with MRI: The Effects of Accurate Fat Spectral Modeling, Journal of Magnetic Resonance Imaging, 2009, 29(6):1332-1339.

Reeder, et al., On the Performance of T2* Correction Methods for Quantification of Hepatic Fat Content, Magnetic Resonance in Medicine, 2012, 67(2):389-404.

Walsh, et al., Adaptive Reconstruction of Phased Array MR Imagery, Magnetic Resonance in Medicine, 2000, 43:682-690.

Yu, et al., Field Map Estimation with a Region Growing Scheme for Iterative 3-Point Water-Fat Decomposition, Magnetic Resonance in Medicine, 2005, 54:1032-1039.

Yu, et al., Single Acquisition Water-Fat Separation: Feasibility Study for Dynamic Imaging, Magnetic Resonance in Medicine, 2006, 55:413-422.

Yu, et al., Multiecho Reconstruction for Simultaneous Water-Fat Decomposition and T2* Estimation, Journal of Magnetic Resonance Imaging, 2007, 26:1153-1161.

Yu, et al., Multi-Echo Water-Fat Separation and Simultaneous R2* Estimation with Multi-Frequency Fat Spectrum Modeling, Magnetic Resonance in Medicine, 2008, 60(5):1122-1134.

Yu, et al., Combination of Complex-Based and Magnitude-Based Multiecho Water-Fat Separation for Accurate Quantification of Fat-Fraction, Magnetic Resonance in Medicine, 2011, 66:199-206.

PCT International Search Report and Written Opinion, PCT/US2014/021872, Jul. 7, 2014, 16 pages.

* cited by examiner

SYSTEM AND METHOD FOR COMBINED CHEMICAL SPECIES SEPARATION AND HIGH RESOLUTION $R_2^*$ MAPPING WITH MAGNETIC RESONANCE IMAGING

STATEMENT REGARDING FEDERALLY SPONSORED RESEARCH

This invention was made with government support under DK083380, DK088925, and EB010384 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for producing a quantitative map of apparent transverse relaxation rate, $R_2^*$, while simultaneously performing water-fat separation.

Water-fat separation methods based on chemical-shift-induced phase differences have received considerable interest in the recent years because of their ability to provide robust fat suppression in the presence of $B_0$ and $B_1$ inhomogeneities. In these methods, images are acquired at different echo times, typically using a multi-echo spoiled gradient echo acquisition, so that separated water and fat images can be subsequently reconstructed on the basis of a predefined signal model equation. Using these methods, proton-density fat-fraction, which has been shown to be a quantitative biomarker for non-alcoholic fatty liver disease ("NAFLD"), can be measured by correcting for a number of confounding factors, including $T_2^*$ decay, $T_1$ bias, complexity of the fat spectrum, noise bias, and eddy-current-induced phase errors. Simultaneous estimation of $R_2^*=1/T_2^*$ can provide high signal-to-noise-ratio ("SNR") measurements of liver iron content, corrected for the presence of both fat and macroscopic $B_0$ inhomogeneities.

In the aforementioned water-fat separation techniques, it is advantageous to use of a very short first echo time to improve the SNR performance of both proton-density fat fraction and $R_2^*$ measurements, especially in cases where transfusion-related iron overload results in markedly increased iron concentration. In those cases, most of the echoes are dominated by noise and contain very little signal, thereby hampering accurate high-resolution $R_2^*$ and fat fraction quantification.

Fractional echo acquisitions can be used to obtain shorter echo times without excessively sacrificing spatial resolution. These fractional echo acquisitions are also capable of reducing the first-order moment in the readout direction and actual pulse sequence repetition time ("TR"). In addition, although parallel imaging and optimized k-space sampling have greatly reduced the need for partial Fourier acquisitions to shorten scan time, partial k-space sampling can allow shorter breath-holds and further reduce scan time for free-breathing acquisitions. The use of partial k-space sampling also increases flexibility in the timing of the multiple echoes by allowing more closely spaced echoes. This flexibility in the echo timing may facilitate improvements in the noise performance of the acquisition, including improvements in $R_2^*$ estimation, and may help avoid water-fat swapping, which is a known challenge for chemical-shift-encoded water-fat separation methods.

Homodyne reconstruction and other related methods that exploit the Hermitian symmetry of k-space to reconstruct fractional-echo and partial Fourier acquisitions demodulate the phase from the complex source images, thus discarding the information required to decompose the water and fat signals. Zero filling can be used to preserve the phase information; however, this results in considerable blurring and thus loss of spatial resolution. Iterative phase-preserving reconstruction algorithms such as POCS ("projection onto convex set") can be used to reconstruct partial k-space acquisitions while preserving the phase information, but at the expense of increased complexity in the reconstruction. Thus, there remains a need to provide a method for water-fat separation and $R_2^*$ quantification that can make use of the advantages proffered by fractional-echo and partial Fourier acquisitions.

A method for performing water-fat separation of partial k-space datasets using an iterative least-squares decomposition method ("IDEAL") and homodyne reconstruction is described by S. B. Reeder, et al., in U.S. Pat. No. 7,298,144. This method was shown to be capable of restoring the resolution loss due to zero filling for qualitative water-fat separation algorithms; however, the method is not capable of accounting for $T_2^*$-induced signal decays, nor did the method account for the spectral complexity of fat.

SUMMARY OF THE INVENTION

The present invention overcomes the aforementioned drawbacks by providing a system and method for combined chemical species separation and high resolution $R_2^*$ mapping that accounts for both $T_2^*$ decay and multi-peak spectral models. This allows the use of homodyne reconstruction techniques to restore resolution in the decomposed water and fat images and corresponding $R_2^*$ map. In addition, this allows the computation of $R_2^*$-corrected images of the separated chemical species that, in the presence of high $R_2^*$ values, can provide more accurate chemical species separation.

It is an aspect of the invention to provide a method for producing a quantitative map of transverse relaxation rate while separating signal contributions from at least two chemical species using an MRI system. The MRI system is used to acquire k-space data using a partial k-space acquisition that samples a fraction of k-space. The acquired k-space data are also acquired such that it corresponds to magnetic resonance signals formed at least at three different echo times. Low-pass filtered data is produced by applying a low-pass filter to the acquired k-space data, and low resolution images are reconstructed from this low-pass filtered data. The low resolution images are then fitted to a signal model to estimate a low resolution field map, a first low resolution image depicting signal contributions from a first chemical species separated from a second chemical species, and a second low resolution image depicting signal contributions from the second chemical species separated from the first chemical species. A weighting is also applied to the acquired k-space data and weighted images are reconstructed from this weighted k-space data. The weighted images are demodulated using the low resolution field map, first low resolution image, and second low resolution image. A transverse relaxation rate, $R_2^*$, is then estimated by fitting the demodulated images demodulated to a signal model that accounts for the performed demodulation. This $R_2^*$ map has a higher spatial resolution than the previously reconstructed low resolution images. The weighted images, low resolution field map, and $R_2^*$ map are then fitted to a signal model to produce a first image depicting signal contributions from the first chemical species separated from a second chemical species, and a second image depicting signal contributions from the second chemical species separated from the first chemical species. These first and second images have a higher spatial resolution than the first and second low resolution images.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
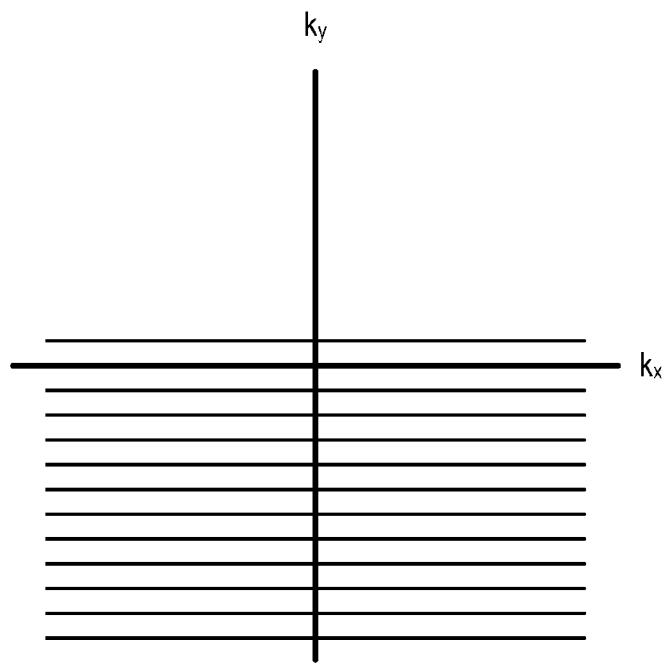
FIG. 1 is an illustration of a k-space sampling pattern indicative of a partial Fourier acquisition.
Figure 2:
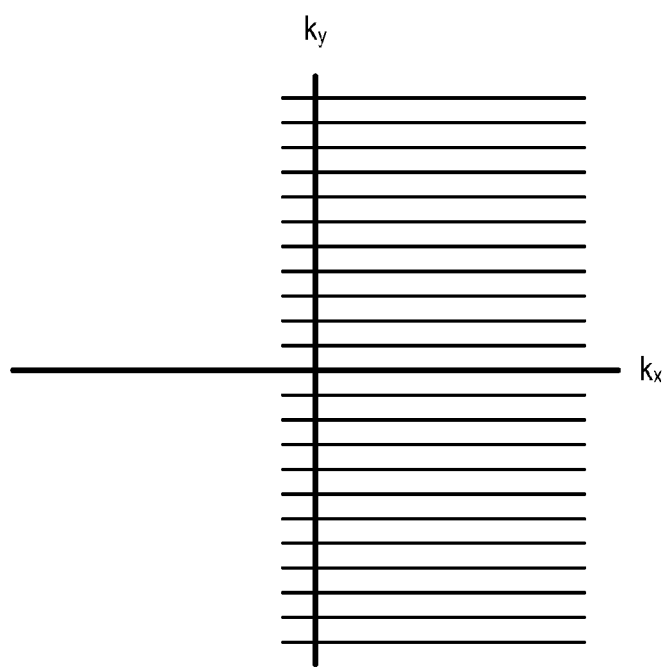
FIG. 2 is an illustration of a k-space sampling pattern indicative of a fractional echo acquisition.

Described here is a method for estimating apparent transverse relaxation rate, $R_2^*$, while simultaneously performing water-fat separation using magnetic resonance imaging ("MRI"). This method combines a homodyne reconstruction of partial k-space datasets and water-fat separation that takes into account not only the spectral complexity of fat, but also magnetic resonance signal decay associated with $T_2^*$. The method of the present invention provides $R_2^*$ and fat fraction quantification using data acquired with a partial k-space acquisition. The method of the present invention is applicable for separating chemical species other than fat or water alone. For example, the signal models presented herein can account for water, fat, silicone, hyperpolarized carbon-13, metabolites containing hyperpolarized carbon-13, hyperpolarized xenon-129, hyperpolarized helium-3, acetone, choline, lactate, and, generally, any system of distinct chemical species with different resonance frequencies. Examples of partial k-space acquisitions include partial Fourier acquisitions, such as the acquisition illustrated in FIG. 1, and fractional echo acquisitions, such as the acquisition illustrated in FIG. 2. In general, these partial k-space acquisitions use the symmetry of k-space to decrease the amount of data required to reconstruct an image.

The method of the present invention can allow for clinical and pre-clinical applications for fat fraction and iron quantification in the presence of iron-overload, in addition to the detection and tracking of super paramagnetic iron oxide particles. The method of the present invention can also be used to advantageously achieve shorter breath-holds and reduced scan time for free-breathing imaging application by using partial Fourier acquisitions for water-fat separation with simultaneous $R_2^*$ estimation.

The method improves upon earlier attempts to combine homodyne reconstruction with water-fat that did not account for the spectral complexity of fat or for the $T_2^*$-induced signal decay. By not accounting for these factors, previous methods were not capable of reconstructing full resolution $R_2^*$ maps for reasons that will be described below. The method of the present invention, however, is capable of reconstructing full resolution quantitative $R_2^*$ maps from partial k-space acquisitions, such as fractional echo acquisitions and partial Fourier acquisitions.

The method of the present invention generally includes producing separate $R_2^*$-corrected water and fat images, quantitative $R_2^*$ maps, and quantitative fat fraction maps. A low resolution field map and a common water-fat phase are used to demodulate the effects of these parameters from the acquired data while separating the water and fat signals. As a consequence, water, fat, and $R_2^*$ can be simultaneously estimated. This estimation is generally performed under the constraint that water and fat signals are real-valued quantities. This approach allows for the reconstruction of a full resolution $R_2^*$ map in addition to water, fat, and fat fraction images that are corrected for the effects of $R_2^*$. A more detailed description of the method is now provided.

The signal from a voxel at location, r, containing a mixture of water and fat, measured at echo times ("TE") $t_n$ (n=1, 2, ..., N) can be described using the following signal model:

$$s_n(r) = \left( \rho_W(r) + \rho_F(r) \sum_{p=1}^{P} \alpha_p \cdot e^{i2\pi \Delta f_p t_n} \right) e^{i2\pi \psi(r) t_n} e^{-R_2^*(r) t_n}; \quad (1)$$

where $\rho_W(r)=|\rho_W(r)|e^{i\phi_W(r)}$ and $\rho_F(r)=|\rho_F(r)|e^{i\phi_F(r)}$ are the complex water and fat signal contributions, respectively; $\Delta f_p$ is the frequency shift of the $p^{th}$ spectral peak of the fat signal relative to the water resonance frequency; $\alpha_p$ is the relative amplitude of the $p^{th}$ spectral peak of fat; $\psi(r)$ is the field map; and $R_2^*(r)$ is the apparent transverse relaxation rate, which is the inverse of the apparent transverse relaxation time, $T_2^*(r)$. For p=1, ..., P, the relative amplitudes of the spectral peaks of fat satisfy the following relationship, $$\sum_{p=1}^{P} \alpha_p = 1. \quad (2)$$

When using a partial k-space acquisition, the signal model of Eqn. (1) changes as follows. In such an acquisition, the signal from a voxel at location, r, again containing a mixture of water and fat and again being measured at multiple echo times, $t_n$, can be described using the following signal model:

$$s_n'(r) = FT\{S_n(k) \cdot G(k)\} = s_n(r) * g(r) \quad (3);$$

where FT{ ... } represents the Fourier transform operator and G(k) represents a sampling window, which is given by, $$G(k) = \begin{cases} 1 & -k_{min} < k < k_{max} \\ 0 & \text{elsewhere}; \end{cases} \quad (4)$$

with $-k_{min}$ and $k_{max}$ being the minimum and maximum sampled k-space locations, respectively.

A low resolution image can be produced from this partial k-space data by applying a one-dimensional low-pass filter along the partially sampled direction, followed by performing a two-dimensional Fourier transform one the filtered data, $$\hat{s}_n(r) = FT\{S_n'(k) \cdot G_L(k)\} = s_n'(r) * g_L(r) \quad (5);$$

where now the sampling window, $G_L(k)$, is given by, $$G_L(k) = \begin{cases} 1 & -k_{min} < k < k_{min} \\ 0 & \text{elsewhere}. \end{cases} \quad (6)$$

From these low resolution images, $\hat{s}_n(r)$, a low resolution field map, $\hat{\psi}(r)$, low-resolution $R_2^*$ map, $\hat{R}_2^*(r)$; and low-resolution water and fat images, $\hat{\rho}_W(r)$ and $\hat{\rho}_F(r)$, can be produced. For example, these low resolution maps and images can be generated using a graph cut algorithm, such as the one described by D. Hernando, et al., in "Robust water/fat separation in the presence of large field inhomogeneities using a graph cut algorithm," *Magn Reson Med,* 2010; 63(1): 79-90. Alternatively, other water-fat separation methods, including IDEAL with region growing, which is described by H. Yu, et al., in "Field map estimation with a region growing scheme for iterative 3-point water-fat decomposition," *Magn Reson Med,* 2005; 54(4):1032-1039, could be used for this purpose.

These maps and images are used to produce the full resolution $R_2^*$ map and water and fat images, as will be described below in detail. However, to produce these full resolution images the method of the present invention also makes use of a pre-weighted version of the partial k-space data to provide a uniform sampling of the real part of the resultant images. This process is now described.

A weighting function can be used to pre-weight the originally acquired partial k-space acquisition so that a uniform weighting in k-space is obtained for the real part of the image. This pre-weighting can be represented by the following:

$$\tilde{s}_n(r) = FT\{S_n'(k) \cdot G_R(k)\} = s_n'(r) * g_R(r) \quad (7);$$

where $G_R(k)$ is a pre-weighting function. One example of this pre-weighting function, $G_R(k)$, is, $$G_R(k) = \begin{cases} H(k) & -k_{min} < k < k_{min} \\ 2 & k_{min} < k < k_{max} \\ 0 & \text{elsewhere;} \end{cases} \quad (8)$$

where $H(k)$ is a Hanning window. By way of example, the Hanning window can have a width of $4 \cdot k_{min}$ that is centered around $k_{min}$, such as the following Hanning window:

$$H(k) = \frac{1}{2}\left(1 - \cos\left(\frac{2\pi k}{4 \cdot k_{min} - 1}\right)\right). \quad (9)$$

Eqn. (7) can be expanded as, $$\tilde{s}_n(r) = \quad (10)$$
$$\left(\left(\left(\rho_W(r) + \rho_F(r)\sum_{p=1}^{P} \alpha_p \cdot e^{i2\pi\Delta f_p t_n}\right) e^{i2\pi\psi(r)t_n} e^{-R_2^*(r)t_n}\right) * g(r)\right) * g_R(r).$$

Assuming that the field map, $\psi(r)$, is smoothly varying (i.e., that the field map, $\psi(r)$, can be reasonably approximated by its low-resolution estimate, $\hat{\psi}(r)$), the corresponding phasor, $\exp(i2\pi\hat{\psi}(r)t_n)$, can be demodulated from the signal model using the low-resolution field map, $\hat{\psi}(r)$, computed as described above. After this demodulation, Eqn. (10) can be written as, $$\tilde{s}_n(r) = ((\rho_W(r)e^{-R_2^*(r)t_n}) * g(r)) * g_R(r) + \quad (11)$$
$$\left(\left(\rho_F(r)\sum_{p=1}^{P} \alpha_p \cdot e^{i2\pi\Delta f_p t_n} e^{-R_2^*(r)t_n}\right) * g(r)\right) * g_R(r);$$

$$\tilde{s}_n(r) \approx \left(|\tilde{\rho}_W(r)|e^{i\varphi_W(r)} + |\tilde{\rho}_F(r)|e^{i\varphi_F(r)}\left(\sum_{p=1}^{P} \alpha_p \cdot e^{i2\pi\Delta f_p t_n}\right)\right)e^{-R_2^*(r)t_n}; \quad (12)$$

where in Eqn. (12), it is assumed that $R_2^*(r)$ varies slowly with position, such that the $R_2^*$ map, $R_2^*(r)$, can be reasonably approximated by its low-resolution estimate, $\hat{R}_2^*(r)$, computed as described above. At an echo time of zero, the phase of both water and fat are a function of only the excitation pulse and receiver coil; therefore, it is reasonable to assume that, at this echo time, water and fat share the same phase, $$\tilde{\phi}_W(r) \approx \tilde{\phi}_F(r) \approx \tilde{\phi}(r) \quad (13).$$

In order for $\tilde{\phi}(r)$ to reflect the true local phase in regions of both water and fat, it is assumed that, $$\tilde{\phi}(r) = \angle(\tilde{\rho}_W(r) + \tilde{\rho}_F(r)) \quad (14).$$

Alternatively, the initial phase of the respective chemical species can be measured separately. This alternative is advantageous when imaging with pulse sequences such as steady-state free precession sequences where the initial phase of water and fat are not equal at an echo time that is of one-half the repetition time. Under these assumptions, and the usual assumption made in conventional homodyne reconstructions that the phase varies slowly with position, so that $\tilde{\phi}(r) \approx \hat{\phi}(r) = \angle(\hat{\rho}_W(r) + \hat{\rho}_F(r))$, the signal model equation of Eqn. (12) can be further simplified by demodulating the common water-fat phase, $\hat{\phi}(r)$, estimated from the low resolution water and fat images. After this demodulation, the signal model of Eqn. (12) can be rewritten as, $$s_n(r) = \tilde{s}_n(r)e^{-i\hat{\varphi}(r)} \approx \left(|\tilde{\rho}_W(r)| + |\tilde{\rho}_F(r)|\left(\sum_{p=1}^{P} \alpha_p \cdot e^{i2\pi\Delta f_p t_n}\right)\right)e^{-R_2^*(r)t_n}. \quad (15)$$

This signal model can be used to estimate the full resolution $R_2^*$ map and full resolution water and fat images from the originally acquired partial k-space data. A decoupled variable projection ("VARPRO") formulation can be used to compute the $R_2^*$ map, as well as the water and fat images, $\tilde{\rho}_W(r)$ and $\tilde{\rho}_F(r)$. The VARPRO technique is described, for example, by D. Hernando, et al., in "Estimation of water/fat images, B0 field map and T2* map using VARPRO," *Proc. Intl. Soc. Mag. Reson. Med.*, 2008; 1517. Alternatively, an IDEAL method that incorporates $T_2^*$, such as the one described by H. Yu, et al., in "Multiecho reconstruction for simultaneous water-fat decomposition and T2* estimation," *J Magn Reson Imaging,* 2007; 26(4):1153-1161, can be used to compute the $R_2^*$ map and water and fat images.

By way of example, $R_2^*(r)$ can be computed at each voxel using VARPRO or $T_2^*$-IDEAL under the additional constraint that water and fat be real-valued, as imposed in conventional homodyne reconstructions to ensure that only the symmetric k-space component is preserved in the final reconstructed images. Additionally, given the field map, $\hat{\psi}(r) \approx \psi(r)$, and the $R_2^*$ map, water and fat images, $\tilde{\rho}_W(r)$ and $\tilde{\rho}_F(r)$, can be estimated at each voxel by solving the corresponding linear problem under the same constraint that water and fat be real-valued.

When multiple coils are used, low-resolution images can be computed for each channel and combined using a complex coil combination algorithm, such as the one described by D. O. Walsh, et al., in "Adaptive reconstruction of phased array MR imagery," *Magn Reson Med,* 2000; 43(5):682-690. Coil-combined low-resolution water images, fat images, and field maps can be obtained using a Graph Cut algorithm or IDEAL, as described above. Similarly, images obtained from the pre-weighted k-space data can be obtained for each channel and combined in the same way. After demodulation of the coil-combined low-resolution field map and water-fat phase, $\tilde{\phi}(r)$, VARPRO or $T_2^*$-IDEAL can be used to obtain the final water and fat images and $R_2^*$ map, as described above.

Figure 3:
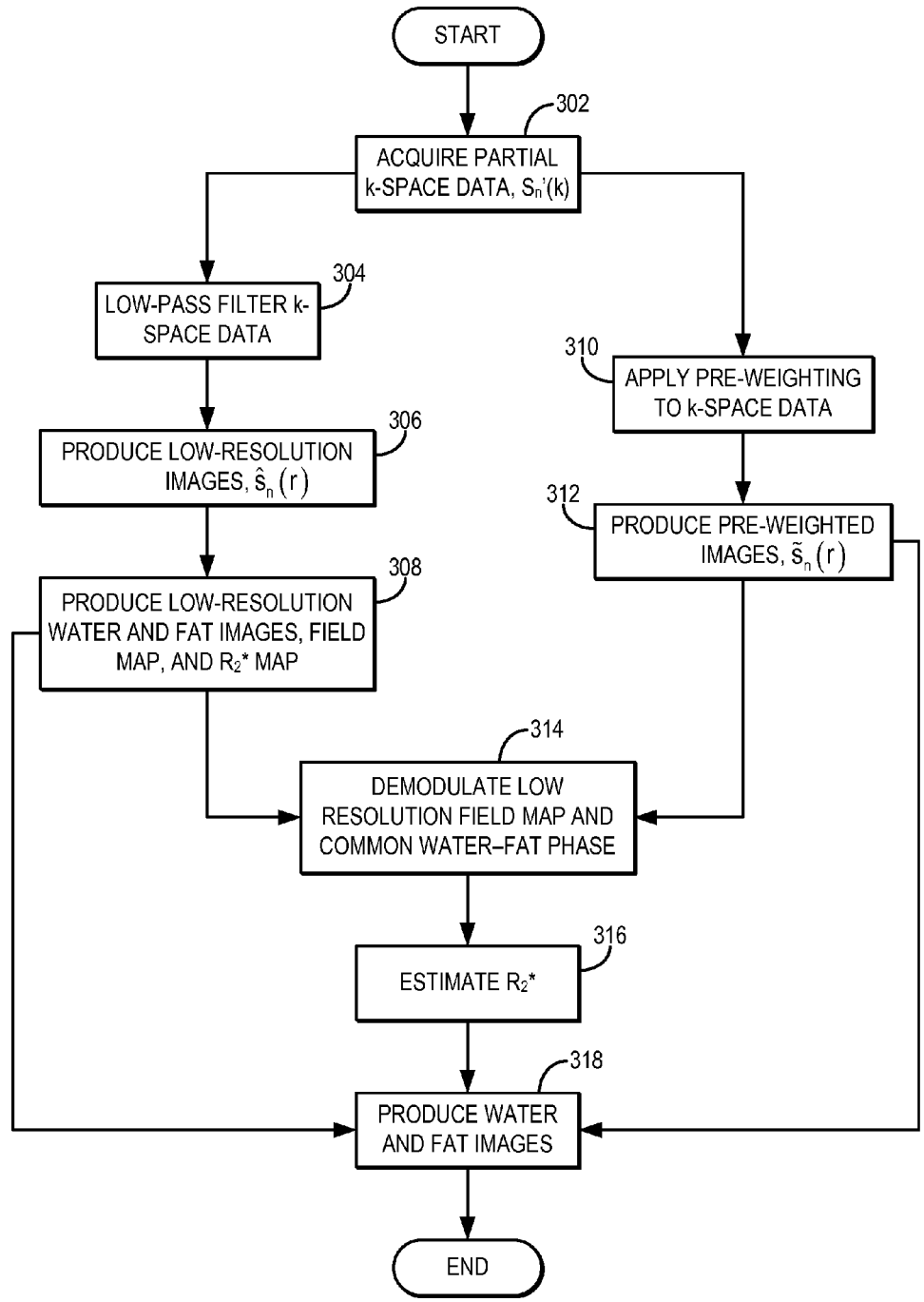
FIG. 3 is a flowchart setting forth the steps of an example of a method for combined chemical species separation and high resolution $R_2^*$ mapping using a partial k-space acquisition.

Referring now to FIG. 3, a flowchart setting forth the steps of an example of a method for jointly producing a quantitative $R_2^*$ map and performing water-fat separation to produce water and fat images is illustrated. The method begins with the acquisition of partial k-space data using, for example, a partial Fourier acquisition, as indicated at step 302. In one branch of processing, the acquired data is filtered using a low-pass filter to preserve only the symmetric center of k-space, as indicated at step 304. From this low-pass filtered data, low resolution images, $\hat{s}_n(r)$, are reconstructed, as indicated at step 306. If a multichannel receive coil array is used to acquire the k-space data, then one image is reconstructed for each coil and these coil images are combined using a complex coil combination to form the low-resolution images, $\hat{s}_n(r)$. Using these low resolution images, low-resolution estimates of the water and fat images, $\hat{\rho}_W(r)$ and $\hat{\rho}_F(r)$; the field map, $\hat{\psi}(r)$; and the $R_2^*$ map, $\hat{R}_2^*(r)$, are produced, as indicated at step 308. These images can be obtained using a graph cut method, such as the one described above, or an IDEAL method, such as IDEAL with region growing, as also described above.

In a separate branch of processing, which may be performed in parallel or in serial with some or all of steps 302-308, the acquired k-space data is pre-weighted using a pre-weighting function, as indicated at step 310. For instance, the k-space data is pre-weighted in accordance with Eqn. (7) by multiplying the k-space data by the pre-weighting function, such as the pre-weighting function, $G_R(k)$, described in Eqn. (8). From this pre-weighted k-space data, pre-weighted images, $\tilde{s}_n(r)$, are reconstructed, as indicated at step 312. These images are preferably reconstructed using, for example, a homodyne reconstruction method; however, other image reconstruction methods, such as a projection onto convex set ("POCS") method or other suitable method, may also be used. Like the low-resolution images reconstructed in step 306, the is a multichannel receive coil array is used to acquire the k-space data, a pre-weighted image can be produced for each coil and then combined using a complex coil combination, such as those described above.

Next, a common water-fat phase, $\hat{\phi}(r)$, and the low-resolution field map, $\hat{\psi}(r)$, are demodulated from the pre-weighted images, as indicated at step 314. The common water-fat phase, $\hat{\phi}(r)$, can be computed from the low-resolution water and fat images produced in step 308, as described above. A full-resolution $R_2^*$ map is then estimated using the demodulated images, as indicated at step 316 and as described above. This map is estimated using a method such as VARPRO or phase-constrained IDEAL, which is described by H. Yu, et al., in "Single acquisition water-fat separation: feasibility study for dynamic imaging," *Magn Reson Med*, 2006; 55(2):413-422, to impose that water and fat signals should be real-valued. The full resolution $R_2^*$ map and the low-resolution field map, $\hat{\psi}(r)$, are then used to estimate the desired water and fat images, as indicated at step 318, by solving the corresponding linear system at each voxel.

Figure 4:
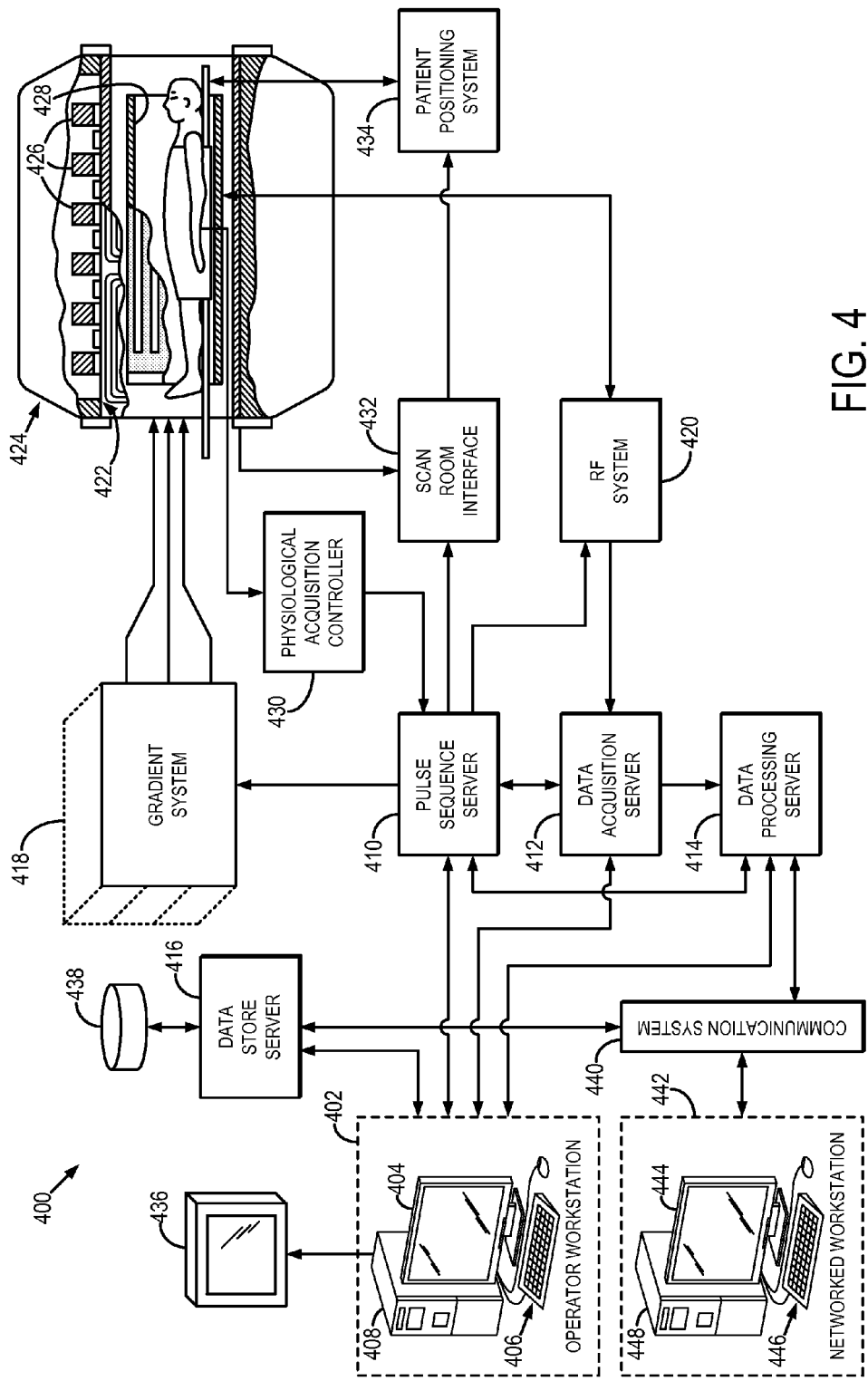
FIG. 4 is a block diagram of an example of a magnetic resonance imaging ("MRI") system that can implement the present invention.

Referring particularly now to FIG. 4, an example of a magnetic resonance imaging ("MRI") system 400 that may implement the present invention is illustrated. The MRI system 400 includes a workstation 402 having a display 404 and a keyboard 406. The workstation 402 includes a processor 408, such as a commercially available programmable machine running a commercially available operating system. The workstation 402 provides the operator interface that enables scan prescriptions to be entered into the MRI system 400. The workstation 402 is coupled to four servers: a pulse sequence server 410; a data acquisition server 412; a data processing server 414; and a data store server 416. The workstation 402 and each server 410, 412, 414, and 416 are connected to communicate with each other.

The pulse sequence server 410 functions in response to instructions downloaded from the workstation 402 to operate a gradient system 418 and a radiofrequency ("RF") system 420. Gradient waveforms necessary to perform the prescribed scan are produced and applied to the gradient system 418, which excites gradient coils in an assembly 422 to produce the magnetic field gradients $G_x$, $G_y$, and $G_z$ used for position encoding MR signals. The gradient coil assembly 422 forms part of a magnet assembly 424 that includes a polarizing magnet 426 and a whole-body RF coil 428.

RF excitation waveforms are applied to the RF coil 428, or a separate local coil (not shown in FIG. 4), by the RF system 420 to perform the prescribed magnetic resonance pulse sequence. Responsive MR signals detected by the RF coil 428, or a separate local coil (not shown in FIG. 4), are received by the RF system 420, amplified, demodulated, filtered, and digitized under direction of commands produced by the pulse sequence server 410. The RF system 420 includes an RF transmitter for producing a wide variety of RF pulses used in MR pulse sequences. The RF transmitter is responsive to the scan prescription and direction from the pulse sequence server 410 to produce RF pulses of the desired frequency, phase, and pulse amplitude waveform. The generated RF pulses may be applied to the whole body RF coil 428 or to one or more local coils or coil arrays (not shown in FIG. 4).

The RF system 420 also includes one or more RF receiver channels. Each RF receiver channel includes an RF preamplifier that amplifies the MR signal received by the coil 428 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \tag{16}$$

and the phase of the received MR signal may also be determined:

$$\varphi = \tan^{-1}\left(\frac{Q}{I}\right). \tag{17}$$

The pulse sequence server 410 also optionally receives patient data from a physiological acquisition controller 430. The controller 430 receives signals from a number of different sensors connected to the patient, such as electrocardiograph ("ECG") signals from electrodes, or respiratory signals from a bellows or other respiratory monitoring device. Such signals are typically used by the pulse sequence server 410 to synchronize, or "gate," the performance of the scan with the subject's heart beat or respiration.

The pulse sequence server 410 also connects to a scan room interface circuit 432 that receives signals from various sensors associated with the condition of the patient and the magnet system. It is also through the scan room interface circuit 432 that a patient positioning system 434 receives commands to move the patient to desired positions during the scan.

The digitized MR signal samples produced by the RF system 420 are received by the data acquisition server 412. The data acquisition server 412 operates in response to instructions downloaded from the workstation 402 to receive the real-time MR data and provide buffer storage, such that no data is lost by data overrun. In some scans, the data acquisition server 412 does little more than pass the acquired MR data to the data processor server 414. However, in scans that require information derived from acquired MR data to control the further performance of the scan, the data acquisition server 412 is programmed to produce such information and convey it to the pulse sequence server 410. For example, during prescans, MR data is acquired and used to calibrate the pulse sequence performed by the pulse sequence server 410. Also, navigator signals may be acquired during a scan and used to adjust the operating parameters of the RF system 420 or the gradient system 418, or to control the view order in which k-space is sampled. In all these examples, the data acquisition server 412 acquires MR data and processes it in real-time to produce information that is used to control the scan.

The data processing server 414 receives MR data from the data acquisition server 412 and processes it in accordance with instructions downloaded from the workstation 402. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 414 are conveyed back to the workstation 402 where they are stored. Real-time images are stored in a data base memory cache (not shown in FIG. 4), from which they may be output to operator display 412 or a display 436 that is located near the magnet assembly 424 for use by attending physicians. Batch mode images or selected real time images are stored in a host database on disc storage 438. When such images have been reconstructed and transferred to storage, the data processing server 414 notifies the data store server 416 on the workstation 402. The workstation 402 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a quantitative map of transverse relaxation rate while separating signal contributions from at least two chemical species using a magnetic resonance imaging (MRI) system, the steps of the method comprising:
   a) acquiring k-space data with the MRI system using a partial k-space acquisition that samples a fraction of k-space, the k-space data corresponding to magnetic resonance signals formed at least at three different echo times;
   b) producing low-pass filtered data by applying a low-pass filter to the k-space data acquired in step a);
   c) reconstructing low resolution images from the low-pass filtered data;
   d) fitting the low resolution images to a signal model to estimate a low resolution field map, a first low resolution image depicting signal contributions from a first chemical species separated from a second chemical species, and a second low resolution image depicting signal contributions from the second chemical species separated from the first chemical species;
   e) applying a weighting to the k-space data acquired in step a);
   f) reconstructing weighted images from the weighted k-space data;
   g) demodulating the weighted images using the low resolution field map, first low resolution image, and second low resolution estimated in step d);
   h) estimating a transverse relaxation rate, $R_2^*$, map by fitting the images demodulated in step g) to a signal model that accounts for the demodulation performed in step g), the $R_2^*$ map having a higher spatial resolution than the low resolution images reconstructed in step c); and
   i) fitting the weighted images reconstructed in step f), the low resolution field map estimated in step d), and the $R_2^*$ map estimated in step h) to a signal model to produce a first image depicting signal contributions from the first chemical species separated from a second chemical species, and a second image depicting signal contributions from the second chemical species separated from the first chemical species, the first and second images having a higher spatial resolution than the first and second low resolution images.

2. The method as recited in claim 1 in which step g) includes demodulating contributions from the low resolution field map and from a phase of signal contributions from the first chemical species and a phase of signal contributions from the second chemical species.

3. The method as recited in claim 2 in which step g) includes calculating a common phase of signal contributions from the first chemical species and the second chemical species.

4. The method as recited in claim 3 in which the common phase is estimated by combining a phase component of the first low resolution image and a phase component of the second low resolution image.

5. The method as recited in claim 1 in which step e) includes multiplying the acquired k-space data by a weighting function.

6. The method as recited in claim 5 in which the weighting function is a Hanning window function.

7. The method as recited in claim 1 in which the first chemical species is water and the second chemical species is fat, and the signal models fit to in steps d), h), and i) model fat as having multiple spectral peaks.

8. A magnetic resonance imaging (MRI) system, comprising:
   a magnet system configured to generate a polarizing magnetic field about at least a portion of a subject arranged in the MRI system;
   a plurality of gradient coils configured to apply a magnetic gradient field to the polarizing magnetic field;
   a radio frequency (RF) system configured to apply an RF field to the subject and to receive magnetic resonance signals therefrom;
   a computer system programmed to:
      direct the plurality of gradient coils and the RF system to acquire k-space data by sampling k-space using a partial k-space acquisition that samples a fraction of k-space, the k-space data corresponding to magnetic resonance signals formed at least at three different echo times;
      produce low-pass filtered data by applying a low-pass filter to the acquired k-space data;
      reconstruct low resolution images from the low-pass filtered data;

fit the low resolution images to a signal model to estimate:
  a low resolution field map;
  a first low resolution image depicting signal contributions from a first chemical species separated from a second chemical species; and
  a second low resolution image depicting signal contributions from the second chemical species separated from the first chemical species;
apply a weighting to the acquired k-space data;
reconstruct weighted images from the weighted k-space data;
demodulate the weighted images using the low resolution field map, first low resolution image, and second low resolution;
estimate a transverse relaxation rate map by fitting the demodulated images to a signal model that accounts for the demodulation, the transverse relaxation rate map having a higher spatial resolution than the reconstructed low resolution images;
fit the weighted images, the low resolution field map, and the transverse relaxation rate map to a signal model to produce:
  a first image depicting signal contributions from the first chemical species separated from a second chemical species; and
  a second image depicting signal contributions from the second chemical species separated from the first chemical species;
  wherein the first and second images have a higher spatial resolution than the first and second low resolution images.

9. The MRI system as recited in claim 8 in which the computer system is programmed to demodulate the weighted images by demodulating contributions from the low resolution field map and from a phase of signal contributions from the first chemical species and a phase of signal contributions from the second chemical species.

10. The MRI system as recited in claim 9 in which the computer system is programmed to demodulate the weighted imaged by first calculating a common phase of signal contributions from the first chemical species and the second chemical species and using that common phase to demodulate the weighted images.

11. The MRI system as recited in claim 10 in which the computer system is programmed to estimate the common phase by combining a phase component of the first low resolution image and a phase component of the second low resolution image.

12. The MRI system as recited in claim 8 in which the computer system is programmed to apply a weighting to the acquired k-space data by multiplying the acquired k-space data by a weighting function.

13. The MRI system as recited in claim 12 in which the computer system is programmed to select a Hanning window function as the weighting function.

* * * * *